United States Patent [19]

Pryor et al.

[11] Patent Number: 4,804,490

[45] Date of Patent: Feb. 14, 1989

[54] METHOD OF FABRICATING STABILIZED THRESHOLD SWITCHING MATERIAL

[75] Inventors: Roger W. Pryor, Bloomfield Hills; Patrick J. Klersy, Livonia; Jerry A. Piontkowski, Berkley; Napolean P. Formigoni, Birmingham, all of Mich.

[73] Assignee: Energy Conversion Devices, Inc., Troy, Mich.

[21] Appl. No.: 107,318

[22] Filed: Oct. 13, 1987

[51] Int. Cl.⁴ .................. H01L 29/12; H01L 45/00; C23C 14/00

[52] U.S. Cl. .............. 252/62.3 BT; 252/62.3 V; 204/192.25; 437/24; 357/2

[58] Field of Search .............. 252/62.3 V, 62.3 BT; 204/192.25; 427/255; 437/24; 357/2

[56] References Cited

U.S. PATENT DOCUMENTS

| | | | |
|---|---|---|---|
| 4,040,917 | 8/1977 | Whittingham | 252/62.3 V |
| 4,217,374 | 8/1980 | Ovshinsky et al. | 204/192.25 |
| 4,375,125 | 3/1983 | Byatt | 437/242 |
| 4,610,731 | 9/1986 | Chevallier | 437/24 |

FOREIGN PATENT DOCUMENTS

| | | | |
|---|---|---|---|
| 55-291133 | 3/1980 | Japan | 437/24 |
| 56-125847 | 10/1981 | Japan | 437/24 |
| 59-56575 | 4/1984 | Japan | 437/24 |
| 679025 | 8/1977 | U.S.S.R. | 437/24 |

OTHER PUBLICATIONS

Smeets et al., "Passivation of Silicon p-n Junctions by Sightly Conductive Chalcogenide Films", J. Electrochem. Soc.: Solid-State Science and Technology, Sep. 1977, pp. 1458-1459.

*Primary Examiner*—Robert L. Stoll
*Assistant Examiner*—Adriana L. Eng
*Attorney, Agent, or Firm*—Kenneth M. Massaroni; Marvin S. Siskind; Richard M. Goldman

[57] ABSTRACT

A method of stabilizing the switching characteristics of a thin film chalcogenide glass material by subjecting said material to a hydrogenated atmosphere, preferably activated hydrogen and argon. It is also preferred to provide a post hydrogenation anneal step.

10 Claims, 2 Drawing Sheets

METHOD OF FABRICATING STABILIZED THRESHOLD SWITCHING MATERIAL

STATEMENT REGARDING FEDERALLY SPONSORED RESEARCH

This invention was made with Government support under Contract No. DAMD17-86-C-6158 awarded by the U.S. Army Medical Corp.

FIELD OF THE INVENTION

The present invention relates generally to solid-state overvoltage protection and transient surge suppression; and more particularly to modified amorphous, chalcogenide-glass materials specifically adapted to suppress high speed energy transients when synthesized to exhibit improved threshold switching stability and uniformity.

BACKGROUND OF THE INVENTION

The need to protect electronic circuitry from overvoltages, especially transient overvoltage conditions, is well known. Most electronic components are built to withstand the application of certain limited voltages thereacross, and thus, may be permanently damaged or at least seriously malfunction if far higher voltages are applied.

There are many sources of transient overvoltages, such as lightning, inductive surge, electrostatic discharge (ESD), and electromagnetic induction (EMI). Further, failure of one "upstream" circuit component of a system may allow excess voltages to be applied across other "downstream" circuit components, resulting in a "domino effect" breakdown of circuit components within that system.

Lightning, ESD and inductive surges are all capable of producing very rapid high voltage transients. An inductive surge produced, for example, by interrupting a running 115 volt motor can be as high as 1,000 volts or more. Electrostatic discharges, such as those produced by a person walking on a wool rug on a dry winter day, can easily result in charging to tens of thousands of volts. Although such electrostatic discharges usually involve a relatively small total energy, they, like inductive surges, are sufficient to destroy many types of microelectronic circuits. Overvoltage transients caused by lightning can deliver, by direct strikes, large currents at tens of thousands to hundreds of thousands of volts. Additionally, by the process of EMI, lightning can generate high voltage, broad spectrum transients with components in the megahertz frequency range and higher.

Conventional devices employed for dealing with relatively small overvoltages include shunting capacitors, breakdown diodes, varistors and inductive coils, all of which devices include various types of switching means and materials. Breakdown diodes such as zener diodes, when reverse biased beyond a certain threshold voltage, conduct large currents. Like virtually all overvoltage protection devices, such a diode is operatively disposed "upstream" of or in parallel with a circuit element to be protected, and is thereby effective in shunting excess voltage applied thereacross to a discharge path such as a neutral line, D.C. common line, chassis or ground. However, such diodes are only capable of handling limited overvoltages without becoming permanently damaged themselves.

Varistors, which are typically made of pressed powders, act somewhat like zener diodes in that they offer a high impedance at low voltages and a relatively low impedance at high voltages. However, varistors are distinguishable from zener diodes in that the current characteristics thereof are symmetrical rather than asymmetrical, and thus can offer limited protection against overvoltage in both directions.

Inductive coils or chokes, while unable to protect circuitry from low frequency or static overvoltages, do tend to filter out rapid voltage transients by presenting a large impedance. Since they also present high impedance to high frequency signals, they are inappropriate for protecting high frequency circuitry from high frequency overvoltages. However, such devices tend to be relatively bulky and expensive.

Spark gaps are another form of overvoltage protection associated with higher power devices. Recently, miniaturized forms of such spark gaps have been developed for use on P.C. boards and the like. Spark gaps contain two opposing electrodes separated by a gas, such as air, which has a desired breakdown, or sparking voltage. When an overvoltage is applied across the spark gap, its nonconductive gas becomes ionized, forming a relatively low resistance path between the electrodes thereof. Although spark gaps have beneficial uses, they usually are not appropriate for use in solid-state circuitry because they are not solid-state devices and because they are fairly large, even in miniaturized form. Also the time required for the operation of spark gaps is usually too slow to provide full protection from extremely rapid transients.

Varistors, inductive coils and spark gaps all share the same shortcoming, i.e., they cannot be readily incorporated into microelectronic devices due to the required manner in which they must be made. Thus, there remains a need for extremely high speed and/or high power surge protection of circuit elements that can be incorporated directly into all types of microelectronic circuitry, as an integral part thereof, to protect such circuitry from rapid, overvoltage transient surges.

In addition to the more common forms of transient surges mentioned hereinabove, the nuclear age has created a new source of overvoltage transients known as nuclear electromagnetic pulse (hereinafter EMP), which pulses pose a serious threat to national security. EMP is produced by Compton electrons scattered by gamma rays from a nuclear explosion colliding with air molecules of the upper atmosphere. Theoretical studies have indicated that if a nuclear device were exploded at a high altitude above most of the earth's atmosphere a large EMP generated therefrom would have sufficient intensity to induce a large current in conductors hundreds or thousands of miles away and thereby destroy electronic equipment connected to or containing such conductors.

EMP is particularly difficult to protect against for three reasons: (1) the extremely rapid rise time; (2) the expected intensity, and (3) the ubiquitous presence, i.e., all conductors of any appreciable length not enclosed with a suitable Faraday shield will act as an antenna, and thus be subject to severe electrical transients. It has been estimated that EMP will produce an extremely high overvoltage within approximately one nanosecond or less and reach a peak field in about 10 nanoseconds, before trailing off in about one microsecond. The peak field produced by a one-megaton warhead exploding in the upper atmosphere may be as high as 50,000 volts/m- eter. Further details about the nature of EMP and the inadequacies of conventional overvoltage protection devices to guard against them is found in "Electromagnetic pulses: potential crippler," *IEEE Spectrum*, May, 1981, pp. 41-46.

Most conventional solid-state overvoltage protection devices are too slow or limited in their power handling capabilities to provide full protection against the effects of very close lightning strikes or EMP. This is because such lightning strikes and EMP can produce overvoltages two or three orders of magnitude or more above the normal operating voltages of the integrated circuits subjected to such transients, thus leading to enormous current surges capable of destroying virtually all types of solid-state semiconductor protection devices. As the energy content of such pulses is increased, the problem becomes more severe, and requires extremely rugged, high capacity overvoltage protection devices, preferably incorporated at the integrated circuit level, to handle any transients which reach such microelectronic circuits. As the size of microelectronic circuit elements is reduced, the problem also becomes more severe since less energy is required to damage smaller devices. As an additional restriction, it is necessary that overvoltage protection devices, when inserted into or included as part of the electronic circuit to be protected, must not impose undue insertion losses in the circuit, or decrease switching speeds or band width by adding significant amounts of capacitance.

One class of overvoltage protection materials which has held great potential for very high speed transient suppression applications are Ovonic threshold switching materials of the type first invented by S. R. Ovshinsky in the 1960's. U.S. Pat. Nos. 3,171,591 (1966) and 3,343,034 (1967) specifically teach that these types of threshold switching materials, as well as the devices incorporating said materials, are suitable for use as surge suppressors, such as for transient inductive pulses and the like. Said materials have been known since at least 1968 to have a switching speed of less than 150 picoseconds, see, e.g., S. R. Ovshinsky, "Reversible Electrical Switching Phenomena in Disordered Structures", *Physical Review Letters*, Vol. 21, No. 20, Nov. 11, 1968, p. 1450(c).

Ovonic threshold switching materials, as generally described for the purposes enumerated herein, exhibit a bistable characteristic, including a threshold voltage and a minimum holding current. Specifically, the devices are constructed to include a semiconductor material with at least a pair of electrodes operatively disposed on opposite sides thereof. The semiconductor material is designed to have a threshold voltage value and a high electrical resistance so as to provide a high resistance state adapted to substantially block current flow therethrough. The high electrical resistance state is initially encountered in response to a voltage above the threshold voltage value and very rapidly decreases (in at least one path between the electrodes) to a low electrical resistance, which is orders of magnitude lower than the high electrical resistance, thus providing a low resistance path for conducting current through the semiconductor material. The current conducting condition is maintained so long as at least a minimum holding current continues to pass through the conducting path through the material. When the current falls below this minimum current value, the material rapidly reverts to its high resistance blocking condition. The voltage drop across the semiconductor material in a threshold switch, when in its conducting condition, is a fraction of the voltage drop across the material when in its high electrical resistance blocking condition, as measured near the threshold voltage value of the switching material.

Many different combinations of atomic elements, when combined in the proper proportions and manner, have been shown to produce a semiconductor material exhibiting the aforementioned threshold switching characteristics. Most commonly, chalcogenide glass semiconductor materials, such as $Te_{36}Ge_{23}S_{21}As_{18}Se_2$ and $Te_{39}As_{36}Si_{17}Ge_7P$, may be used. Examples of other such materials and threshold switching devices made therefrom can be found in the following list of U.S. patents, all of which are assigned to the assignee of the present invention, and all of which are hereby incorporated by reference:

| | |
|---|---|
| 3,271,591 | 3,571,671 |
| 3,343,034 | 3,571,672 |
| 3,571,669 | 3,588,638 |
| 3,571,670 | 3,611,063 |

While the above mentioned materials, when utilized to fabricate a threshold switch, possess favorable threshold switching characteristics, several limitations have prevented them from gaining wide acceptance for use as surge suppressors. In the first place, it is required that the chalcogenide materials from which said surge suppressing switches are fabricated exhibit a high degree of stability and uniformity so that threshold voltages and holding voltages can be reliably and uniformly set. It is necessary that the switching stability of the chalcogenide glass material remain constant despite the passage of time or through repeated use. Also, when utilized in a large matrix array, it is essential that the switching characteristics of discrete switches remain uniform from switch to switch in that matrix. Heretofore, uniformity of switching was not within acceptable tolerances, with the variance in switching characteristics being the most significant in the observed values of the difference between the first fire voltage and the threshold voltage. As used herein, the threshold voltage is defined as that voltage at which the thin film chalcogenide glass material switches from its high resistance state to provide at least one low resistance path for conducting excess current therethrough. Also, as used herein, first fire voltage is defined as the threshold voltage observed the first time the thin film chalcogenide glass material is exposed to an overvoltage.

From the foregoing discussion, it should be apparent that having uniform, reproducible values for these two switching characteristics (first fire voltage and threshold voltage) is essential to developing and manufacturing reliable surge protection devices. It is to the ultimate development of modified, thin film, chalcogenide glass switching material, which material exhibits uniform, stable threshold and first fire voltage characteristics that the instant invention is directed.

BRIEF SUMMARY OF THE INVENTION

The invention described herein provides a method for improving the uniformity and stability of threshold switching material fabricated from thin film chalcogenide glass materials. This is accomplished by subjecting the host matrix of those materials to a hydrogenated atmosphere. In the preferred embodiments, this hydrogenated atmosphere is provided either during the reactive sputtering of the chalcogenide glass material, itself, or during a subsequent plasma annealing process.

More particularly, the inventive method disclosed herein, provides for controllably subjecting an amorphous chalcogenide glass material to an activated hydrogen plasma so as to stabilize and improve uniformity of the threshold switching characteristics thereof. While not fully understood, it is believed that the hydrogen either combines with chemical vacancies which exist due to the amorphous nature of the chalcogenide glass material or combines with oxygen in the chalcogenide glass material, which hydrogen-oxygen molecules are then removed as water vapor. The method includes the steps of providing a thin film chalcogenide glass material possessing threshold switching characteristics, and controllably subjecting said material to a hydrogenated atmosphere, said hydrogen adapted to favorably interact with the chalcogenide glass material to stabilize and promote uniformity of the threshold switching voltage and first fire voltage of said material. The ability to subject the material to a controlled amount of hydrogen is important because excess hydrogen, rather than improving switching characteristics, deleteriously effects the stability and uniformity of the switching characteristics of the material. The stabilized, more uniform threshold switching material is specifically characterized by a relatively high electrical resistance at operating voltages below a nominal voltage level and substantially lower electrical resistance through at least one conductive pathway at voltages above said nominal voltage level.

The chalcogenide glass material is preferably selected from any one of a number of amorphous semiconductor materials; though in a preferred embodiment, the amorphous chalcogenide glass material has the composition $Te_{36}Ge_{23}S_{21}As_{18}Se_2$. Other sulfur-based chalcogenide glass compositions may also be used. The chalcogenide glass material is fabricated by a reactive sputtering process so that the hydrogen atmosphere can be utilized either during the material fabrication process, itself, or during a subsequent anneal step.

The amorphous chalcogenide glass material is preferably subjected to an activated hydrogen-argon atmosphere under conditions selected to favorably facilitate the interaction of controlled amounts of hydrogen with the host matrix of the material. In order to controllably interact the hydrogen with the chalcogenide glass material, it is preferable to provide specific constraints upon those temperature, pressure and energy levels at which the hydrogenating atmosphere proceeds so as to achieve the appropriate interactive relationship.

DETAILED DESCRIPTION OF THE INVENTION

In order to improve the stability and uniformity of the switching characteristics of amorphous chalcogenide glass materials, i.e., the uniformity of the threshold voltage and first fire voltage, there is disclosed herein a method of fabricating an improved chalcogenide glass threshold switching material. The improved material comprises an amorphous chalcogenide glass material which has been modified by exposure to a stabilizing element, preferably hydrogen. The method is characterized by controllably exposing a stabilizing and uniformity-promoting element in preselected amounts, to the amorphous chalcogenide glass material at controlled temperatures, pressures and energy levels. The stabilizing and uniformity-promoting element is exposed to the chalcogenide glass material from a precursor source of preferably molecular hydrogen, into a reactive environment. In this way, it now becomes possible to fabricate uniform, stable, hydrogen modified amorphous chalcogenide switching material possessing improved threshold switching characteristics. The improved threshold switching material is characterized by substantially improved threshold switching stability and uniformity, particularly with respect to threshold voltage and first fire voltage.

The inventors herein, theorize that the exposure of the chalcogenide glass materials to a hydrogenated atmosphere may modify said materials in one of two ways. One possibility is that the hydrogen combines with chemical vacancies which exist due to the amorphous nature of the chalcogenide material. It is possible that the hydrogen, so combined, influences the energy and spatial distribution of the density of states in the chalcogenide glass material; thereby resulting in the modification of the recombination sites of the amorphous chalcogenide material. However, preliminary analysis has failed to show the incorporation of hydrogen into the host matrix of that chalcogenide material. Since detection by this analysis was limited to hydrogen incorporation exceeding 5-10%, it remains impossible to accurately reflect upon the degree or lack of hydrogen incorporation. Therefore, the instant inventors also propose a second hypothesis, i.e., that the hydrogen from the atmosphere interacts with the chalcogenide glass material and bonds preferentially with oxygen present therein so as to form water ($H_2O$) molecules. The $H_2O$ molecules, formed by the introduction of hydrogen, effuses during subsequent processing as during the anneal process, described hereinafter. The elimination of oxygen, a contaminant, from the material could also be responsible for the improved switching properties.

Figure 2A:
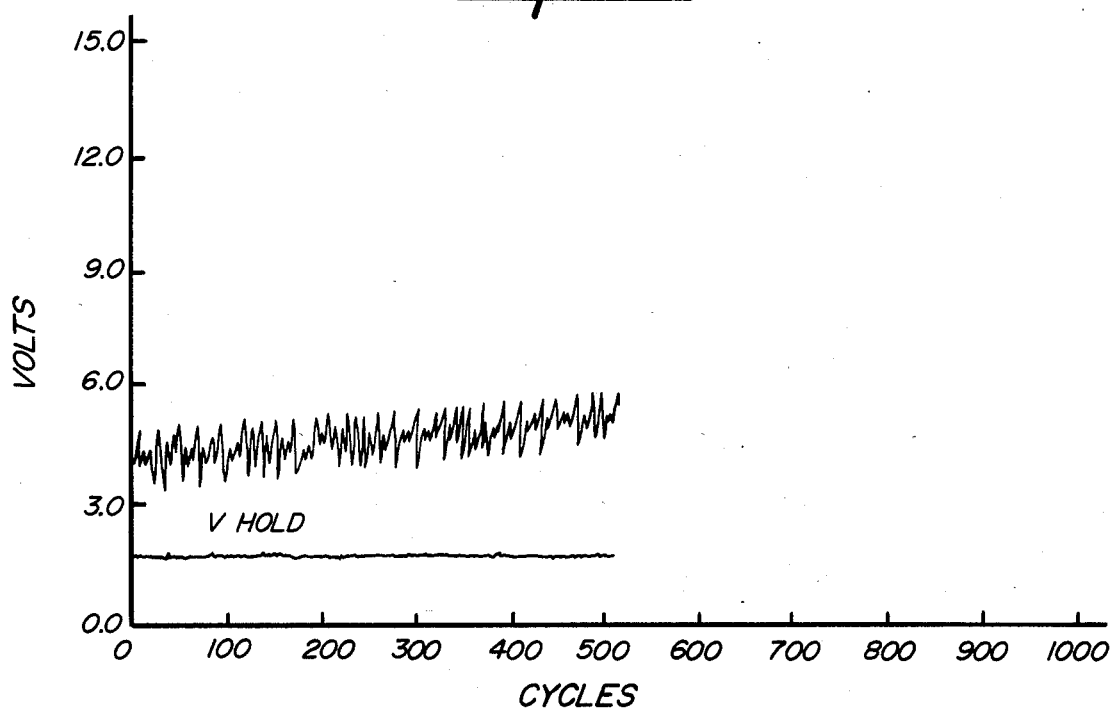
FIGS. 2A and 2B are graphic representations of the observed values for first fire voltage and threshold voltage of non-stabilized and hydrogen stabilized chalcogenide glass switching materials, respectively.
Figure 2B:
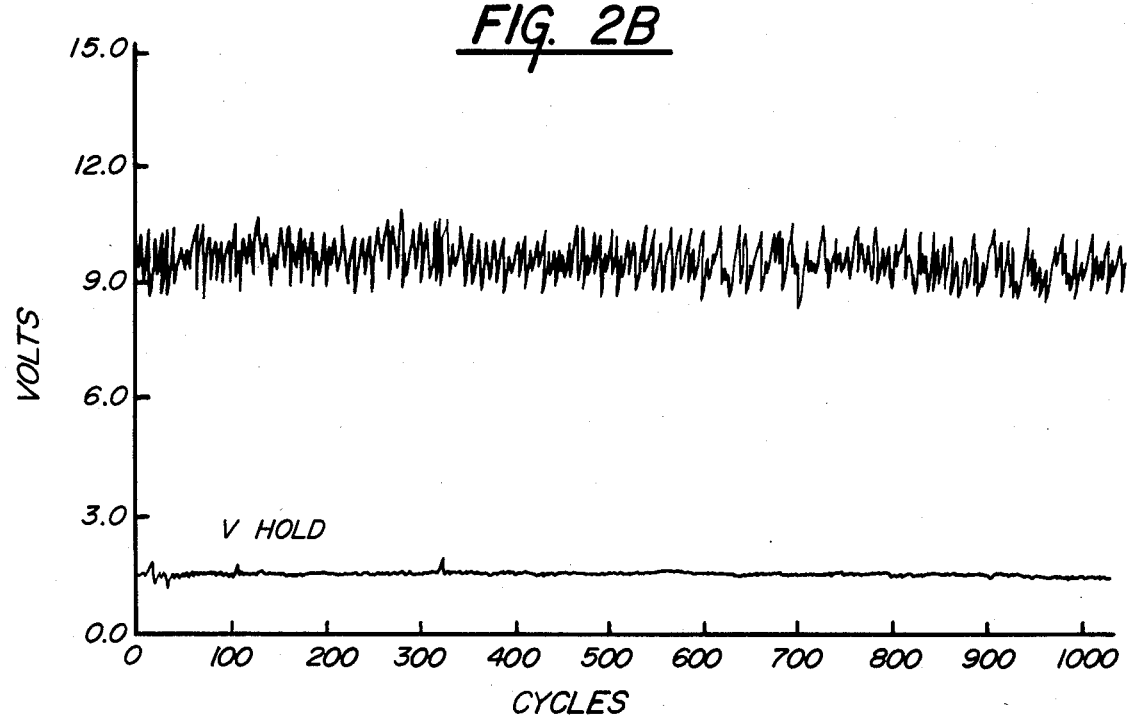

FIGS. 2A and 2B graphically demonstrate the improvement in threshold switching stability and uniformity provided by subjecting chalcogenide glass materials to a hydrogenated atmosphere. FIGS. 2A and 2B, respectively, depict in graphic form, the switching stability and uniformity of non-stabilized and hydrogen stabilized (the specific fabrication techniques of which will be described in detail hereafter) chalcogenide glass material, having the nominal composition of $Te_{36}Ge_{23}S_{21}As_{18}Se_2$.

Specifically, FIGS. 2A and 2B are measurement graphs which plot voltage (as in first fire and threshold voltage) along the ordinate and cycles, which represents the number of times a device is subjected to a transient surge, along the abscissa. Looking now specifically at FIG. 2A, there is depicted therein a chart recording the first fire voltage and threshold voltage of a non-modified chalcogenide switching material over approximately 500 cycles. As can be seen from the graph, the observed value of the threshold voltage $V_{th}$)

is somewhat inconsistent, ranging from approximately 4.0 volts during the earlier cycles, up to approximately 6.0 volts with increased cycling, the average being about 5.1 volts. Also, the observed first fire voltage is approximately 20.0 volts which is considerably higher than the voltage observed during subsequent cycles. It should be apparent that this lack of uniformity renders chalcogenide glass materials useless as surge suppressors. Further, because of the extremely high first fire voltage a number of "burn in" cycles is required before the non-modified device can be used. Additionally, these "burn-in" voltage cycles may in fact damage the device resulting in the long-term degradation observed for threshold voltage.

Turning now to FIG. 2B, there is depicted therein a chart recording the threshold voltage and first fire voltage of a device employing a hydrogen stabilized chalcogenide glass material. As can be seen from said graph, the material displays excellent stability and uniformity over many cycles, (approximately 1000). The observed values remain substantially constant during the entire cycling period, with an average threshold voltage of 9.4 volts. Additionally, the first fire voltage is 8.70 volts, a value well within the range of average observed values, thus precluding the need for (and potential damage caused by), the "burn in" cycle. A device displaying stability and uniformity such as this can easily serve as a surge protection means since it can be reliably predicted to afford overvoltage protection at a given voltage, regardless of whether it is the first or 1000th overvoltage surge.

Thus, FIGS. 2A and 2B conclusively demonstrate the significant improvement in first fire and threshold switching stability and uniformity which may be achieved by subjecting chalcogenide glass materials to a stabilizing element such as hydrogen.

As was mentioned hereinabove, exposing the amorphous chalcogenide glass material to too great an amount of hydrogen resulted in diminished threshold switching performance of said material. Experimentation has shown that exposure to even extremely small percentages of hydrogen yields positive effects upon the stability and uniformity of the threshold and first fire voltage. However, switching stability and uniformity rapidly degrade once the process reaches the point at which hydrolysis of the chalcogenide glass material begins to occur. Thus, it is apparent that the exposure of the chalcogenide glass material to a hydrogenated atmosphere must be controlled in order to positively impact upon the switching characteristics thereof.

The amorphous chalcogenide switching material may be subjected to the stabilizing element, such as hydrogen, in any number of methods, at least two of which are preferred and detailed hereinafter. Employing the first preferred method, the host matrix of the chalcogenide glass switching material is subjected to a hydrogenated atmosphere as one step of a continuous deposition process. Specifically, during the sputtering of said chalcogenide switching material onto a substrate, hydrogenation can be established by providing an atmosphere of hydrogen gas in argon. The sputtering deposition of the glass material is preferably followed by a thermal anneal. The specific parameters for carrying out this process are set forth in detail in Example I which follows hereinafter.

Figure 1:
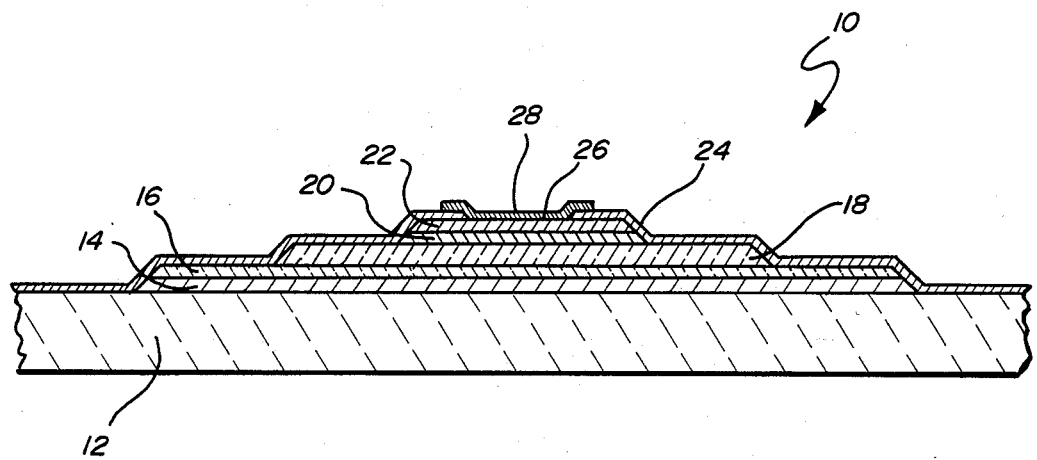
FIG. 1 depicts a cross-sectional side view of an overvoltage suppression device employing the stabilized threshold switching material of the present application.

The second preferred method employed for subjecting the chalcogenide glass switching material to a hydrogenated atmosphere, is a post deposition process which begins after the deposition of the chalcogenide glass material has been completed. By employing this post deposition method, a completed threshold switching device, as depicted in FIG. 1, incorporating the thin film layer of chalcogenide material is subjected to a hydrogen plasma annealing process. This post deposition process requires placing the chalcogenide switching material in an evacuated chamber which is operatively interconnected with a system capable of providing an annealing plasma. A source of hydrogen, preferably $H_2$ gas, is introduced into the annealing system at a preselected flow rate, temperature and pressure and a plasma is initiated. The chalcogenide switching material is then subjected to the annealing plasma for a period of time so as to allow for the reaction of at least a fractional atomic percentage of hydrogen with the chalcogenide glass material. The specific parameters for this annealing process are described in Example II.

It is essential that certain parameters are established to insure the controlled modification of the host matrix of chalcogenide glass material. The exposure of the chalcogenide glass material to the hydrogen may be limited by controlling the following parameters: the temperature, i.e., as in the annealing process temperature; the pressure within the reaction chamber; the energy level at which the exposure of the chalcogenide materials to hydrogen occurs; the flow rate of the precursor source of hydrogen; and the length of time during which the chalcogenide material is exposed to the hydrogenated atmosphere. By employing various combinations of these control parameters, the instant inventors have been able to favorably modify the chalcogenide glass material. Further, through extensive experimentation, the instant inventors have developed a method for optimizing the switching characteristic in a given amorphous chalcogenide glass material.

Turning now to FIG. 1, there is depicted therein a solid state, high current carrying, threshold switching device 10 of a type incorporating a layer of the hydrogen stabilized, amorphous chalcogenide glass switching material fabricated by the method of the instant invention. The threshold switching device 10 includes a substrate 12 which may be either conductive or insulating, depending upon the specific use and location of said device. Examples of conductive substrate materials for the device include, but are not limited to, stainless steel, copper, aluminum and degenerately doped crystalline silicon; while suitable insulating substrates for the device include, but are not limited to, glass, crystalline silicon and crystal sapphire wafers.

Deposited atop said substrate 12 is a highly conductive electrode 14 formed of molybdenum, though other highly conductive metals such as graphite, refractory metal oxides, carbide, sulphide and tungsten may be employed with equal advantage. The electrode 14 may be deposited to a thickness of about 1,500 to 25,000 Angstroms using any conventional or suitable technique such as sputtering, evaporation, vapor deposition, or the like. Preferably, the electrode is deposited as amorphous films by maintaining the substrates upon which they are deposited sufficiently cool so that the atoms condense into a generally disordered state upon contacting said surface. Atop said electrode 14, there is deposited a thin film layer 16 of electrically conductive, phase stable, non-single crystal, non-switching carbon. Said thin film carbon layer 16 is deposited to a thickness of about 1,000 Angstroms, although thicknesses of about 100 Angstroms (to provide complete coverage of the electrode surface) up to about 5000 Angstroms are also preferred. Note that each of the electrodes of the device 10 are in intimate electrical contact with the superposed thin film layers of carbon such that current flows into one electrode through its respective carbon layer, through the active body of chalcogenide glass material, into the second layer of carbon and from there into the second electrode. (Although not illustrated, the devices may also be constructed without the carbon layers, provided that the remaining electrodes are fully compatible with the body of chalcogenide glass material with which it is in contact.) The layers of carbon 18 are preferably deposited using d.c.-magnetron sputtering. Typical process parameters are a substrate temperature of about 100 degrees Centigrade, a pressure of about 0.5 pascal, a deposition rate of about 200–300 Angstroms per minute and a distance of approximately 6 cm. between the source and target. Preferably, a pure (99.9 percent) carbon source is used so that the resultant film is substantially pure amorphous carbon.

A layer of the hydrogen stabilized, thin film chalcogenide glass switching material 18 is next deposited upon said thin film layer of carbon 16. The layer of chalcogenide glass material 18 may be deposited to a thickness of approximately 100 (sufficient to obtain complete coverage of the carbon layer 16) to 50,000 Angstroms depending upon the magnitude of the threshold switching voltage desired. The thickness of the chalcogenide glass material is related to the specified threshold voltage which is desired, and may be adjusted in a manner well understood in the art. On the average, the threshold voltage of threshold-type semiconductor materials is approximately 30 volts per micron of conduction path length. Therefore, in order to achieve a threshold voltage on the order of 8 to 9 volts in a vertical threshold device of the type shown in FIG. 1, for example, the active layer is made approximately 3000 angstroms to 4000 angstroms thick.

As described in the examples which follow hereinafter, the chalcogenide glass material is subjected to a hydrogenated atmosphere (hydrogen being the stabilizing and uniformity promoting element) either during the fabrication of the chalcogenide material itself, or during a subsequent, post deposition, anneal step. The preferred threshold switching materials from which the active layer is fabricated include one or more chalcogen elements, i.e., sulphur, tellurium, and selenium. Preferred compositions include, but are not limited to materials such as $Te_{36}Ge_{23}S_{21}As_{18}Se_2$ and other sulfur based chalcogenide glasses. After the deposition of the layer of chalcogenide glass material 18 in the hydrogen atmosphere, another layer of thin film carbon 20 and an upper electrode 22 of the type and thicknesses described hereinabove are sequentially formed there atop.

Finally, a layer of insulating material 24, such as silicon oxide, silicon nitride, silicon carbon or siliconoxynitride is deposited over the previously deposited layers so as to encapsulate the upper surface of the entire device. A via 26 is then formed, as by conventional photolithographic techniques through said insulating layer 24 above a central portion of the upper electrode 22. Thereafter, a top conductive layer 28 is deposited above said via, which conductive layer 28 may be patterned to provide means of communication with other small area devices also deposited on the common substrate 12 or otherwise electrically interconnected to other said devices within system. A preferred metal from which layer 28 is fabricated is aluminum. It is to be noted that the inventive concept disclosed in the instant specification relates to surge suppression material characterized by improved stability and uniformity. It is to be appreciated that the description of the device set forth hereinabove is solely for the purposes of satisfying best mode requirements. However, different materials and layer thicknesses of component parts of the devices utilizing the improved material can be employed without departing from the spirit or scope of the instant invention.

In operation of the electrical device 10, current from the first electrode thereof passes through at least one portion of the first carbon layer, through at least a filamentary path or portion of the chalcogenide glass material and through the second carbon film to the second electrode. Since current takes the path of least resistance, which should always be through the shortest or most direct route through material of uniform resistivity, the current conduction path in the thin carbon films and the semiconductor layer of FIG. 1 should be substantially vertical.

EXAMPLES

Examples of the hydrogen stabilized amorphous chalcogenide glass material of the instant invention are set forth hereinafter to demonstrate the fact that the scope of this disclosure is not process limited. Accordingly, two specific examples of preferred hydrogen introduction methods will be discussed in detail in the following paragraphs.

Note that in fabricating the device 10, it is preferred to deposit the multiple layers thereof in sequence while substrate 12 is continuously maintained under a partial vacuum. This helps ensure that extremely clean interfaces are formed between the layers, and greatly reduces the chance for any appreciable amount of contaminants such as air, water vapor, dust or the like to contaminate the interfaces. This not only helps ensure fine physical integrity of the interfaces, but also helps ensure the formation of high quality electrical interfaces between the layers. Such clean interfaces are believed to help greatly reduce possible localized heating effects and nucleation sites for undesired localized crystallization of the semiconductor materials, which may well adversely affect the electrical stability.

EXAMPLE I

The first method by which the host matrix of a thin film chalcogenide glass material is exposed to a hydrogenated atmosphere, demonstrates that improved threshold switching can be obtained by subjecting the precursor constituent elements of that material to hydrogen during the actual deposition of said material onto a substrate. Specifically, the chalcogenide glass material is deposited by a reactive sputtering process of a type known in the art. In this sputtering process, the substrate is first cleaned as by conventional cleaning methods and then introduced into a vacuum deposition chamber under the following deposition conditions: chamber pressure is pumped down and held at about 0.2 pascal; a deposition rate of 100–300 angstroms per minute and a sputtering target comprising those materials to be sputtered into the substrate web, of approximately three inches in diameter. The power applied to said target is approximately 42 watts thus yielding an applied power density of approximately 0.7 watts/square centimeter.

The thin film layers, specified hereinabove, from which the threshold switching device 10 of the instant invention was fabricated, were successively deposited in a multiple-layer deposition process, after which each successively deposited layer was subjected to various etching processes. Specifically, after all the layers (contacts, barriers and active layers) were deposited, they were subsequently exposed to conventional photolithographic patterning, and etched as by wet and dry etching processes well known by those skilled in the art. Since techniques for the deposition of materials by sputtering or evaporation and subsequently etching said deposited materials have long been known in the art, further amplification thereof is not necessary.

A flow of approximately ½ percent hydrogen in argon is initiated and introduced into the sputtering chamber. This atmospheric concentration of hydrogen is maintained throughout the entire process of depositing the chalcogenide glass material, thus subjecting said material to the modifying element throughout the entire deposition thereof. As mentioned hereinabove, the thickness of the chalcogenide material is determined by the desired threshold voltage and can be altered by varying the length of time the chalcogenide deposition process remains operative.

The sputtering process may be followed immediately or at some subsequent time by a thermal annealing process adapted to further stabilize the properties of the hydrogenated chalcogenide glass material. Specifically, the hydrogen stabilized material is subjected to an annealing temperature of approximately 175-250 degrees Centigrade for 30 minutes. The hydrogen modified material is then removed from the annealing temperature and allowed to cool. Of course, if the operative mechanism by which stability is improved, results from the interaction of hydrogen with oxygen in the glassy material, this anneal provides for the effusion of $H_2O$ therefrom.

Through extensive experimentation the inventors have determined that the combination of parameters specified hereinabove most effectively stabilizes the threshold switching characteristics of the device 10 fabricated from the thin film chalcogenide glass materials.

EXAMPLE II

The second method by which the host matrix of a chalcogenide glass material may be subjected to a hydrogenated atmosphere involves a post deposition plasma annealing process employing the use of a hydrogen plasma atmosphere.

Specifically, the deposited layer of chalcogenide glass material of a $Te_{36}Ge_{23}S_{21}As_{18}Se_2$ composition, is placed into a conventional parallel plate plasma chamber which is operatively connected to a source of hydrogen gas ($H_2$). The chamber is cooled to and maintained at a temperature of approximately 25 degrees Centigrade and a pressure of 100 millitorr. A 50 sccm flow of hydrogen gas ($H_2$) is started and an r.f. plasma is then initiated by the application of a 200 watt source of applied power. The plasma was maintained for approximately 3.5 minutes and then extinguished. The flow of gases is then terminated and the chamber is flooded with argon.

It is important to note that no single deposition parameter of either method (such as flow rate or exposure time) is sacrosanct. As long as the deposition parameters, taken as a whole, provide for optimizing the threshold switching characteristics of the host matrix of the chalcogenide glass material, the improvement will be within the spirit or scope of the present invention.

We claim:

1. A method of stabilizing the threshold switching characteristics of a thin film chalcogenide glass material, said method comprising the steps of:
   (a) providing a thin film chalcogenide glass material possessing threshold switching characteristics;
   (b) subjecting said chalcogenide glass material to a hydrogenated atmosphere for stabilizing the threshold switching characteristics thereof; and
   (c) controlling the temperature, pressure and energy levels during which the hydrogenation occurs so as to provide first, second and third independent controls upon the rate at which said stabilization process proceeds.

2. The method as recited in claim 1, including the further step of, subsequent to step (c), subjecting said chalcogenide glass material to a thermal anneal.

3. The method as recited in claim 1, wherein the thin film chalcogenide glass material comprises an amorphous chalcogenide glass semiconductor material.

4. The method as recited in claim 3, wherein the amorphous chalcogenide glass semiconductor material comprises $Te_{36}Ge_{23}S_{21}As_{18}Se_2$.

5. The method as recited in claim 2, wherein hydrogen gas, ($H_2$), is the source of hydrogen in said atmosphere.

6. The method as recited in claim 5, wherein the hydrogen gas is diluted with argon.

7. The method as recited in claim 5, wherein said hydrogen gas is subjected to an energetic process so as to provide activated hydrogen.

8. The method as recited in claim 7, wherein said activated hydrogen is utilized to plasma anneal said chalcogenide glass material.

9. The method as recited in claim 7, wherein step (a) comprises fabricating, by reactive sputtering, said chalcogenide material in an atmosphere of activated hydrogen.

10. The method as recited in claim 9, including the further step of subjecting said chalcogenide glass material to a thermal anneal after completion of the hydrogenated reactive sputtering process.

* * * * *